(12) United States Patent
Lim et al.

(10) Patent No.: US 10,884,065 B2
(45) Date of Patent: Jan. 5, 2021

(54) APPARATUS AND METHOD OF TESTING PERFORMANCE OF BATTERY CELL

(71) Applicant: LG Chem, Ltd., Seoul (KR)

(72) Inventors: Jin-Hyung Lim, Daejeon (KR); Du-Seong Yoon, Daejeon (KR); Won-Tae Joe, Daejeon (KR); Yong-Seok Choi, Daejeon (KR)

(73) Assignee: LG Chem, Ltd.

( * ) Notice: Subject to any disclaimer, the term of this patent is extended or adjusted under 35 U.S.C. 154(b) by 226 days.

(21) Appl. No.: 16/070,701

(22) PCT Filed: Jun. 29, 2017

(86) PCT No.: PCT/KR2017/006915
§ 371 (c)(1),
(2) Date: Jul. 17, 2018

(87) PCT Pub. No.: WO2018/038383
PCT Pub. Date: Mar. 1, 2018

(65) Prior Publication Data
US 2019/0079136 A1    Mar. 14, 2019

(30) Foreign Application Priority Data

Aug. 26, 2016 (KR) .......................... 10-2016-0109271

(51) Int. Cl.
*G01R 31/385* (2019.01)
*H01M 10/0525* (2010.01)
(Continued)

(52) U.S. Cl.
CPC ........... *G01R 31/386* (2019.01); *G01R 31/36* (2013.01); *G01R 31/367* (2019.01);
(Continued)

(58) Field of Classification Search
CPC .................................................. G01R 31/386
See application file for complete search history.

(56) References Cited

U.S. PATENT DOCUMENTS

| 8,234,087 B2 | 7/2012 | Majima |
| 9,097,773 B2 | 8/2015 | Joe et al. |

(Continued)

FOREIGN PATENT DOCUMENTS

| CN | 102944849 A | 2/2013 |
| CN | 103424710 A | 12/2013 |

(Continued)

OTHER PUBLICATIONS

International Search Report and Written Opinion for Application No. PCT/KR2017/006915, dated Sep. 29, 2017 (9 Pages).

(Continued)

*Primary Examiner* — Hyun D Park
(74) *Attorney, Agent, or Firm* — Lerner, David, Littenberg, Krumholz & Mentlik, LLP

(57) ABSTRACT

Provided are apparatus and method of testing electrochemical performance of a battery cell in a nondestructive manner The apparatus according to an embodiment of the present disclosure includes: a memory configured to store first profile data, second profile data, a first positive electrode upper limit, a first positive electrode lower limit, a first negative electrode upper limit, and a first negative electrode lower limit that are determined in advance through a preliminary experiment with respect to each of a plurality of reference cells; a sensing unit configured to measure an open-circuit voltage of a test cell according to a variation in a state of charge (SOC) of the test cell; and a controller electrically connected to the memory and the sensing unit. The controller is configured to test performance of the test cell in a nondestructive manner based on data regarding the (Continued)

reference cells and data measured by the sensing unit stored in the memory.

11 Claims, 12 Drawing Sheets

(51) Int. Cl.
*H01M 10/44* (2006.01)
*H01M 10/48* (2006.01)
*G01R 31/36* (2020.01)
*G01R 31/396* (2019.01)
*G01R 31/3842* (2019.01)
*G01R 31/388* (2019.01)
*G01R 31/367* (2019.01)

(52) U.S. Cl.
CPC ....... *G01R 31/388* (2019.01); *G01R 31/3842* (2019.01); *G01R 31/396* (2019.01); *H01M 10/0525* (2013.01); *H01M 10/44* (2013.01); *H01M 10/48* (2013.01); *Y02E 60/10* (2013.01); *Y02T 10/70* (2013.01)

(56) References Cited

U.S. PATENT DOCUMENTS

| | | |
|---|---|---|
| 9,263,908 B2 | 2/2016 | Ju et al. |
| 9,509,019 B2 | 11/2016 | Chiang et al. |
| 9,575,130 B2 | 2/2017 | Rueger et al. |
| 2012/0105069 A1 | 5/2012 | Wang et al. |
| 2013/0076363 A1 | 3/2013 | Takahashi et al. |
| 2013/0317771 A1* | 11/2013 | Laskowsky .......... G01R 31/374 702/63 |
| 2014/0084939 A1* | 3/2014 | Sejima ................ G01R 31/392 324/537 |
| 2014/0212757 A1 | 7/2014 | Takijiri et al. |
| 2014/0218042 A1* | 8/2014 | Koba ................... G01R 31/392 324/430 |
| 2014/0239915 A1 | 8/2014 | Takahashi |
| 2015/0051855 A1 | 2/2015 | Joe et al. |
| 2015/0066407 A1 | 3/2015 | Joe et al. |
| 2015/0268306 A1 | 9/2015 | Sugiyama et al. |
| 2017/0146610 A1 | 5/2017 | Cha et al. |
| 2017/0212170 A1* | 7/2017 | Torai .................... G01R 31/396 |

FOREIGN PATENT DOCUMENTS

| | | |
|---|---|---|
| CN | 104011930 A | 8/2014 |
| CN | 104395771 A | 3/2015 |
| JP | 2011258337 A | 12/2011 |
| JP | 5035401 B2 | 9/2012 |
| JP | 2015105875 A | 6/2015 |
| JP | 2015135286 A | 7/2015 |
| JP | 2015178963 A | 10/2015 |
| KR | 10-2014-0003325 A | 1/2014 |
| KR | 10-1454831 B1 | 10/2014 |
| KR | 10-1487494 B1 | 1/2015 |
| KR | 10-1502440 B1 | 3/2015 |
| KR | 10-2015-0060373 A | 6/2015 |
| KR | 10-2015-0086954 A | 7/2015 |
| KR | 10-2016-0027241 A | 3/2016 |
| KR | 10-2016-0048585 A | 5/2016 |

OTHER PUBLICATIONS

Chinese Search Report for Application No. CN 201780008464.9 dated Dec. 17, 2019, 2 pages.

* cited by examiner

APPARATUS AND METHOD OF TESTING PERFORMANCE OF BATTERY CELL

TECHNICAL FIELD

The present disclosure relates to an apparatus and method of testing performance of a battery cell, and more particularly, to an apparatus and method of testing an electrochemical performance of a battery cell in a nondestructive manner The present application claims priority under 35 U.S.C. § 119 to Korean Patent Application No. 10-2016-0109271 filed on Aug. 26, 2016 in the Republic of Korea, and under 35 U.S.C. § 365 to PCT/KR2017/006915 filed on Aug. 26, 2016, the disclosures of which are incorporated herein by reference.

BACKGROUND

Recently, demand for portable electronic devices such as laptops, video cameras, mobile phones, etc. has been rapidly increasing, and electric vehicles, energy storing batteries, robots, satellites, etc. have been developed. Accordingly, research onto a high-performance battery that is repeatedly rechargeable has been actively conducted.

Nickel cadmium batteries, nickel hydrogen batteries, nickel zinc batteries, lithium secondary batteries, etc. are currently commercialized, and the lithium secondary batteries among those batteries are highlighted due to such advantages as free charging/discharging because a memory effect rarely occurs in the lithium secondary batteries when being compared with nickel-based secondary batteries, very low self-discharging rate, and high energy density.

A battery cell included in a battery basically includes a positive electrode, a negative electrode, and an electrolyte. As operating ions (e.g., lithium ions) involved in electrochemical reaction of a battery cell move from a positive electrode to a negative electrode or from a negative electrode to a positive electrode, charging/discharging of the battery cell is executed.

A battery cell is manufactured through an activation process. In an activation process, charging/discharging of a battery cell are executed a predetermined number of times under a preset condition, in a state in which the battery cell is connected to a charging/discharging apparatus. When a performance test method according to the related art is used, a maximum capacity value that is actually extractable from a battery cell may be estimated according to a ratio between a charging capacity and a discharging capacity of a battery cell, which are measured during performing an activation process. The maximum capacity value may be referred to as a full charge capacity (FCC).

However, according to the performance test method according to the related art, there is a limitation that only information about usage area including a voltage window, etc. at opposite ends of the battery cell may be only roughly identified, but information about usage area of each of the positive and negative electrodes of the battery cell may not be identified.

Also, since some of the lithium ions are irreversibly lost due to solid electrolyte interface (SEI), etc. generated because lithium ions react with carbon used in a negative electrode during the activation process, the maximum capacity value of the battery cell becomes less than a predetermined design capacity. However, the performance test method according to the related art may not provide information about a factor resulting in the difference between the predetermined design capacity value and the maximum capacity value of the battery cell after the activation process.

To address the above problem, a three-electrode test method has been suggested.

According to the three-electrode test method, a potential of each of a positive electrode and a negative electrode in a battery cell is compared with that of a reference electrode to measure a usage area and a maximum capacity of each of the positive and negative electrodes in the battery cell. However, in order to execute the three-electrode test method, the battery cell including the positive electrode and the negative electrode has to be disassembled to additionally attach a reference electrode to the battery cell. Moreover, since the reference electrode may affect electrochemical characteristics of the battery cell, the measurement result of the battery cell having the reference electrode may not correspond to the actual electrochemical characteristics of the battery cell having no reference electrode.

SUMMARY

The present disclosure is designed to solve the problems of the related art, and therefore the present disclosure is directed to providing an apparatus and method of precisely testing performance of a battery cell without disassembling the battery cell to attach a reference electrode, etc.

The other objects and advantages of the present disclosure will be apparent from the following description and the exemplary embodiments of the present disclosure. Also, it will be readily understood that the objects and advantages of the present disclosure are realized by the means and combinations thereof set forth in the appended claims.

Various embodiments of the present disclosure to achieve the above goal are as follows.

In one aspect of the present disclosure, there is provided an apparatus for testing performance of a battery cell, the apparatus including: a memory configured to store first profile data, second profile data, a first positive electrode upper limit, a first positive electrode lower limit, a first negative electrode upper limit, and a first negative electrode lower limit that are determined in advance through a preliminary experiment with respect to each of a plurality of reference cells; a sensing unit configured to measure an open-circuit voltage of a test cell according to a variation in a state of charge (SOC) of the test cell; and a controller electrically connected to the memory and the sensing unit and configured to test performance of the test cell in a nondestructive manner The first profile data indicates a variation in an open-circuit voltage of a positive electrode of the reference cell according to a variation in an amount of lithium ions stored in the positive electrode of the reference cell, and the second profile data indicates a variation in an open-circuit voltage of a negative electrode of the reference cell according to a variation in an amount of lithium ions stored in the negative electrode of the reference cell. The first positive electrode upper limit corresponds to the amount of lithium ions stored in the positive electrode of the reference cell at an upper limit within a predetermined SOC range, the first positive electrode lower limit corresponds to the amount of lithium ions stored in the positive electrode of the reference cell at a lower limit within the predetermined SOC range, the first negative electrode upper limit corresponds to the amount of lithium ions stored in the negative electrode of the reference cell at an upper limit within the predetermined SOC range, and the first negative electrode lower limit corresponds to the amount of lithium ions stored in the negative electrode of the reference cell at a lower limit within the predetermined SOC range. The controller is configured to generate third profile data indicating a variation in the open-circuit voltage of each of the plurality of the reference cells with respect to the predetermined SOC range, based on the first profile data, the second profile data, the first positive electrode upper limit, the first positive electrode lower limit, the first negative electrode upper limit, and the first negative electrode lower limit, and to generate fourth profile data indicating a variation in an open-circuit voltage at opposite ends of the test cell with respect to the predetermined SOC range measured by the sensing unit. The controller is configured to estimate a second positive electrode upper limit, a second positive electrode lower limit, a second negative electrode upper limit, and a second negative electrode lower limit of the test cell, based on the third profile data and the fourth profile data. The second positive electrode upper limit corresponds to the amount of lithium ions stored in a positive electrode of the test cell at an upper limit within the predetermined SOC range, the second positive electrode lower limit corresponds to an amount of lithium ions stored in the positive electrode of the test cell at a lower limit within the predetermined SOC range, the second negative electrode upper limit corresponds to an amount of lithium ions stored in a negative electrode of the test cell at an upper limit within the predetermined SOC range, and the second negative electrode lower limit corresponds to an amount of lithium ions stored in the negative electrode of the test cell at a lower limit of the predetermined SOC range.

The controller may be configured to declare a cost function indicating a sum of squares of a residual between the third profile data and the fourth profile data with respect to a plurality of sample values within the predetermined SOC range, and to estimate the second positive electrode upper limit, the second positive electrode lower limit, the second negative electrode upper limit, and the second negative electrode lower limit of the test cell, which make a value of the cost function minimum through a predetermined probability model.

The controller may be configured to estimate the second positive electrode upper limit, the second positive electrode lower limit, the second negative electrode upper limit, and the second negative electrode lower limit of the test cell, which make the value of the cost function minimum, by using an optimization algorithm given in advance or a Bayesian estimation method.

The memory may be configured to further store a maximum capacity value of the test cell. The controller may be configured to calculate a first capacity value indicating a maximum capacity of the positive electrode of the test cell by using equation 1 below, and to calculate a second capacity value indicating a maximum capacity of the negative electrode of the test cell by using equation 2 below

[Equation 1]

$$Q^t_P = Q^t_F/(p_f'-p_i')$$

[Equation 2]

$$Q^t_N = Q^t_F/(n_f'-n_i'),$$

where $Q^t_F$ denotes the maximum capacity value, $p_f'$ denotes the second positive electrode upper limit, $p_i'$ denotes the second positive electrode lower limit, $n_f'$ denotes the second negative electrode upper limit, $n_i'$ denotes the second negative electrode lower limit, $Q^t_P$ denotes the first capacity value, and $Q^t_N$ denotes the second capacity value.

The controller may be configured to calculate an irreversible capacity of the test cell by using equation 3 below

[Equation 3]

$$Q_{loss} = (Q^t_P \times p_i') - (Q^t_N \times n_i')$$

where $Q_{loss}$ denotes the irreversible capacity.

The controller may be configured to calculate a ratio between the maximum capacity of the negative electrode of the test cell and the maximum capacity of the positive electrode of the test cell by using equation 4 below

[Equation 4]

$$R_{NP} = Q^t_N/Q^t_P = (p_f'-p_i')/(n_f'-n_i'),$$

where $R_{NP}$ denotes the ratio between the maximum capacity of the negative electrode of the test cell and the maximum capacity of the positive electrode of the test cell.

The controller may be configured to generate the fourth profile data by averaging a voltage profile during charging the test cell and a voltage profile during discharging the test cell within the predetermined SOC range.

The controller may be configured to generate the fourth profile data based on a voltage at opposite ends of the test cell, which is measured through a voltage relaxation method, within the predetermined SOC range.

In another aspect of the present disclosure, there is also provided a method of testing performance of a battery cell, the method including: (a) storing first profile data, second profile data, a first positive electrode upper limit, a first positive electrode lower limit, a first negative electrode upper limit, and a first negative electrode lower limit that are determined in advance through a preliminary experiment with respect to each of a plurality of reference cells; (b) generating third profile data indicating a variation in an open-circuit voltage of the each of the plurality of reference cells within a predetermined state of charge (SOC) range, based on the first profile data, the second profile data, the first positive electrode upper limit, the first positive electrode lower limit, the first negative electrode upper limit, and the first negative electrode lower limit; (c) measuring an open-circuit voltage of a test cell according to a variation in an SOC of the test cell; (d) generating fourth profile data indicating a variation in an open-circuit voltage at opposite ends of the test cell with respect to the predetermined SOC range, based on measured open-circuit voltage of the test cell; and (e) estimating a second positive electrode upper limit, a second positive electrode lower limit, a second negative electrode upper limit, and a second negative electrode lower limit of the test cell, based on the third profile data and the fourth profile data. The first profile data indicates a variation in an open-circuit voltage of a positive electrode of the reference cell according to a variation in an amount of lithium ions stored in the positive electrode of the reference cell, and the second profile data indicates a variation in an open-circuit voltage of a negative electrode of the reference cell according to a variation in an amount of lithium ions stored in the negative electrode of the reference cell. The first positive electrode upper limit corresponds to the amount of lithium ions stored in the positive electrode of the reference cell at an upper limit within the predetermined SOC range, the first positive electrode lower limit corresponds to the amount of lithium ions stored in the positive electrode of the reference cell at a lower limit within a predetermined SOC range, the first negative electrode upper limit corresponds to the amount of lithium ions stored in the negative electrode of the reference cell at an upper limit within the predetermined SOC range, the first negative electrode lower limit corresponds to the amount of lithium ions stored in the negative electrode of the reference cell at a lower limit within the predetermined SOC range, the second positive electrode upper limit corresponds to the amount of lithium ions stored in a positive electrode of the test cell at an upper limit within the predetermined SOC range, and the second positive electrode lower limit corresponds to an amount of lithium ions stored in the positive electrode of the test cell at a lower limit within the predetermined SOC range, the second negative electrode upper limit corresponds to an amount of lithium ions stored in a negative electrode of the test cell at an upper limit within the predetermined SOC range, and the second negative electrode lower limit corresponds to an amount of lithium ions stored in the negative electrode of the test cell at a lower limit of the predetermined SOC range.

The operation (e) may include: (e-1) declaring a cost function indicating a sum of squares of a residual between the third profile data and the fourth profile data with respect to a plurality of sample values within the predetermined SOC range, and (e-2) estimating the second positive electrode upper limit, the second positive electrode lower limit, the second negative electrode upper limit, and the second negative electrode lower limit of the test cell, which make a value of the cost function minimum through a predetermined probability model.

The operation (e-2) may include estimating the second positive electrode upper limit, the second positive electrode lower limit, the second negative electrode upper limit, and the second negative electrode lower limit of the test cell, which make the value of the cost function minimum, by using an optimization algorithm given in advance or a Bayesian estimation method.

According to at least one of embodiments of the present disclosure, performance test of a battery cell may be performed without disassembling the battery cell in order to attach a reference electrode, etc. That is, information about electrochemical performance of each of a positive electrode and a negative electrode of a battery cell may be obtained in a nondestructive manner.

Also, according to at least one of the embodiments of the present disclosure, a usage area of each of a positive electrode and a negative electrode in the battery cell may be estimated.

Also, according to at least one of the embodiments of the present disclosure, a maximum capacity of each of the positive and negative electrodes in the battery cell per unit area may be estimated.

Also, according to at least one of the embodiments of the present disclosure, a capacity ratio between the positive electrode and the negative electrode of the battery cell may be estimated.

Also, according to at least one of the embodiments of the present disclosure, it may be rapidly checked whether a manufactured battery cell is defective.

The effects of the present disclosure are not limited to the aforementioned effects, and other effects of the present disclosure may be understood by the following description and will become apparent from the embodiments of the present disclosure.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Also, in the detailed description of the embodiments of the present disclosure, detailed depictions of well-known related functions and configurations may be omitted so as not to obscure the art of the present disclosure with superfluous detail.

It will be further understood that the terms "comprises" and/or "comprising," when used in this specification, specify the presence of stated components, but do not preclude the presence or addition of one or more components. In addition, the term such as <control unit> provided herein indicates a unit performing at least one function or operation, and may be realized by hardware, software, or a combination of hardware and software.

Moreover, when it is mentioned that a part is "connected" with another part, it means not only "direct connection" but also "indirect connection" with different elements interposed between the two parts.

Hereinafter, a test apparatus and method according to embodiments of the present disclosure will be described in detail below. Hereinafter, a battery cell will be referred to as a 'cell' for convenience of description. Also, various voltage profiles that will be described later are not restricted to continuous format, but may have a discrete format.

Figure 1:
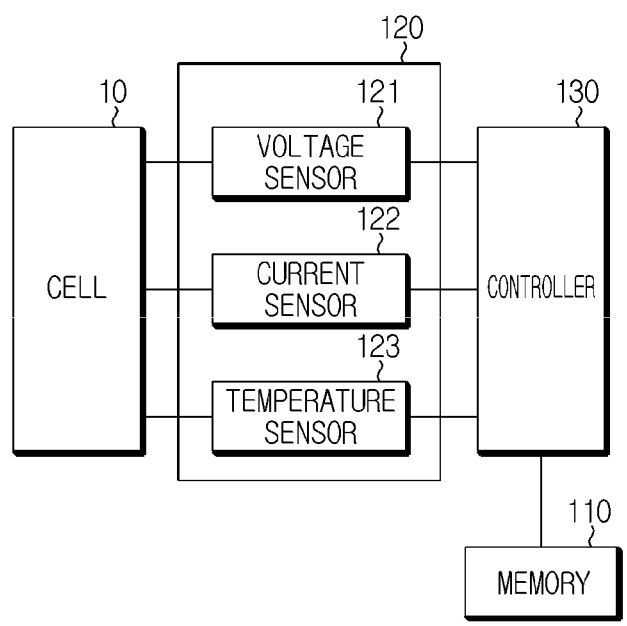
FIG. 1 is a diagram showing a functional structure of a test apparatus according to an embodiment of the present disclosure.

FIG. 1 is a diagram showing a functional configuration of a test apparatus 100 according to an embodiment of the present disclosure.

Referring to FIG. 1, the test apparatus 100 includes a memory 110, a sensing unit 120, and a controller 130.

The memory 110 is configured to store reference information that is predetermined to indicate performance of each of a plurality of reference cells. The reference information is used as a comparing criterion for testing performance of a test cell that will be described later. The reference information includes first profile data, second profile data, a first positive electrode upper limit, a first positive electrode lower limit, a first negative electrode upper limit, and a first negative electrode lower limit. The reference information is obtained through preliminary experiments on a reference cell at a beginning of life (BOL). Here, BOL may denote a duration from an initial time point of manufacturing a reference cell to a time point when charging/discharging cycle reaches a predetermined number of times.

In detail, the first profile data indicates a variation in an open-circuit voltage of a positive electrode of the reference cell according to a variation in an amount of lithium ions stored in a positive electrode of the reference cell. For example, as charging of the reference cell progresses, the amount of lithium ions stored in the positive electrode of the reference cell is gradually decreased, whereas a potential of the positive electrode of the reference cell gradually increases.

The second profile data indicates a variation in an open-circuit voltage of a negative electrode in the reference cell according to a variation in the amount of lithium ions stored in the negative electrode of the reference cell. For example, as the charging of the reference cell progresses, the amount of lithium ions stored in the negative electrode of the reference cell gradually increases, whereas a potential of the negative electrode of the reference cell gradually decreases.

The first positive electrode upper limit corresponds to the amount of lithium ions stored in the positive electrode of the reference cell at an upper limit within a predetermined SOC range. In detail, the first positive electrode upper limit denotes a stoichiometric value representing a value within a range of 0 to 1, wherein the value is obtained by subtracting a first experiment value indicating an amount of operating ions (e.g., lithium ions) stored in the positive electrode of the reference cell from a first critical value at a time point when a state of charge (SOC) of the reference cell reaches an upper limit of a predetermined SOC range, based on the first critical value indicating a maximum amount of the operating ions that may be stored in the positive electrode of the reference cell. For example, when the amount of operating ions stored in the positive electrode of the reference cell is 10% of the first critical value when the SOC of the reference cell reaches the upper limit of the predetermined SOC range, the first positive electrode upper limit is (100%−10%)/100%=0.90.

The first positive electrode lower limit corresponds to the amount of lithium ions stored in the positive electrode of the reference cell at a lower limit within a predetermined SOC range. In detail, the first positive electrode lower limit denotes a stoichiometric value representing a value within a range of 0 to 1, wherein the value is obtained by subtracting a second experiment value indicating an amount of operating ions stored in the positive electrode of the reference cell from the first critical value at a time point when the SOC of the reference cell reaches a lower limit of a predetermined SOC range, based on the first critical value. For example, when the amount of operating ions stored in the positive electrode of the reference cell is 80% of the first critical value when the SOC of the reference cell reaches the lower limit of the predetermined SOC range, the first positive electrode lower limit is (100%−80%)/100%=0.20. As the SOC of the reference cell decreases, the amount of operating ions stored in the positive electrode of the reference value increases, and thus, it is obvious to one of ordinary skill in the art that the first positive electrode lower limit is less than the first positive electrode upper limit.

The first negative electrode upper limit corresponds to the amount of lithium ions stored in the negative electrode of the reference cell at an upper limit within a predetermined SOC range. In detail, the first negative electrode upper limit denotes a stoichiometric value representing a third experiment value within a range of 0 to 1, wherein the third experiment value indicates an amount of operating ions stored in the negative electrode of the reference cell at a time point when the SOC of the reference cell reaches an upper limit of a predetermined SOC range, based on a second critical value indicating a maximum amount of operating ions that may be stored in the negative electrode of the reference cell. For example, when the amount of operating ions stored in the negative electrode of the reference cell is 95% of the second critical value when the SOC of the reference cell reaches the upper limit of the predetermined SOC range, the first negative electrode upper limit is 95%/100%=0.95.

The first negative electrode lower limit corresponds to the amount of lithium ions stored in the negative electrode of the reference cell at a lower limit within a predetermined SOC range. In detail, the first negative electrode lower limit denotes a stoichiometric value representing a fourth experiment value within a range of 0 to 1, wherein the first experiment value indicates an amount of operating ions stored in the negative electrode of the reference cell at a time point when the SOC of the reference cell reaches a lower limit of a predetermined SOC range, based on the second critical value. For example, when the amount of operating ions stored in the negative electrode of the reference cell is 5% of the second critical value when the SOC of the reference cell reaches the lower limit of the predetermined SOC range, the first negative electrode lower limit is 5%/100%=0.05. As the SOC of the reference cell decreases, the amount of operating ions stored in the negative electrode of the reference value decreases, and thus, it is obvious to one of ordinary skill in the art that the first negative electrode lower limit is less than the first negative electrode upper limit.

Also, the memory 110 may additionally store various data, commands, and software required in overall operations of the test apparatus 100. The memory 110 may include a storage medium corresponding to at least one type of a flash memory type, a hard disk type, a solid state disk (SSD) type, a silicon disk drive (SDD) type, a multimedia card micro type, a random access memory (RAM), a static RAM (SRAM), a read-only memory (ROM), an electrically erasable programmable read-only memory (EEPROM), and a programmable ROM (PROM).

The sensing unit 120 may include at least one of a voltage sensor 121, a current sensor 122, and a temperature sensor 123. At least one of the voltage sensor 121, the current sensor 122, and the temperature sensor 123 separately measures at least one of a voltage, a current, and a temperature of a test cell 10 and transmits data representing the measured value to the controller 130, in response to a control signal provided from the controller 130.

The controller 130 is configured to test the performance of a test cell in a nondestructive manner by referring to the data and commands stored in the memory 110 or by driving software. The controller 130 may execute the software for performing at least one of measurement of voltage, current, and temperature of the test cell, SOC calculation, SOH estimation, and temperature management.

The controller 130 may be implemented by at least one of application specific integrated circuits (ASICs), digital signal processors (DSPs), digital signal processing devices (DSPDs), programmable logic devices (PLDs), field programmable gate arrays (FPGAs), microprocessors, and electric units for performing other functions, as hardware.

The controller 130 may generate third profile data representing a variation in the open-circuit voltage at opposite ends in the reference cells with respect to a predetermined SOC range, based on the first profile data, the second profile data, the first positive electrode upper limit, the first positive electrode lower limit, the first negative electrode upper limit, and the first negative electrode lower limit of each of a plurality of reference cells. In detail, the third profile data indicates a difference between a positive electrode open-circuit voltage profile of the reference cell provided by the first profile data and a negative electrode open-circuit voltage profile of the reference cell provided by the second profile data, that is, the open-circuit voltage profile at opposite ends of the reference cell.

In addition, the controller 130 may generate fourth profile data related to a test cell that is separate from the reference cell. Here, the test cell may be designed and manufactured to have electrochemical characteristics that are identical with those of the reference cell. However, the test cell and at least one of the reference cells may have different performances from each other due to an element such as a processing error.

In more detail, the controller 130 may generate the fourth profile data representing the open-circuit voltage profile at opposite ends of the test cell with respect to a predetermined SOC range, based on voltage data of the test cell provided from the sensing unit 120. That is, the fourth profile data represents a variation in the open-circuit voltage at opposite ends of the test cell with respect to a predetermined SOC range.

When the generation of the fourth profile data is finished, the controller 130 may estimate a second positive electrode upper limit, a second positive electrode lower limit, a second negative electrode upper limit, and a second negative electrode lower limit of the test cell, based on the third profile data and the fourth profile data.

Here, the second positive electrode upper limit corresponds to an amount of operating ions estimated to be stored in the positive electrode of the test cell when the SOC of the test cell is the upper limit of the predetermined SOC range. In detail, the second positive electrode upper limit denotes a stoichiometric value representing a value within a range of 0 to 1, wherein the value is obtained by subtracting a first estimation value indicating an amount of operating ions estimated to be stored in the positive electrode of the test cell when the SOC of the test cell reaches the upper limit of a predetermined SOC range from the first critical value, based on the first critical value. For example, when the first estimation value is 5% of the first critical value, the second positive electrode upper limit is (100%−5%)/100%=0.95.

The second positive electrode lower limit corresponds to an amount of operating ions estimated to be stored in the positive electrode of the test cell when the SOC of the test cell is the lower limit of the predetermined SOC range. In detail, the second positive electrode lower limit denotes a stoichiometric value representing a value within a range of 0 to 1, wherein the value is obtained by subtracting a second estimation value indicating an amount of operating ions estimated to be stored in the positive electrode of the test cell from the first critical value at a time point when the SOC of the test cell reaches a lower limit of a predetermined SOC range, based on the first critical value. For example, when the second estimation value is 5% of the first critical value, the second positive electrode lower limit is (100%−95%)/100%=0.05. As the SOC of the test cell decreases, the amount of operating ions stored in the positive electrode of the test value increases, and thus, it is obvious to one of ordinary skill in the art that the second positive electrode lower limit is less than the second positive electrode upper limit.

The second negative electrode upper limit corresponds to an amount of operating ions estimated to be stored in the negative electrode of the test cell when the SOC of the test cell is the upper limit of the predetermined SOC range. In detail, the second negative electrode upper limit denotes a stoichiometric value representing a third estimation value within a range of 0 to 1, wherein the third estimation value indicates an amount of operating ions estimated to be stored in the negative electrode of the test cell at a time point when the SOC of the test cell reaches an upper limit of a predetermined SOC range, based on the second critical value. For example, when the amount of operating ions stored in the negative electrode of the test cell is 90% of the second critical value when the SOC of the test cell reaches the upper limit of the predetermined SOC range, the second negative electrode upper limit is 90%/100%=0.90.

The second negative electrode lower limit corresponds to an amount of operating ions estimated to be stored in the negative electrode of the test cell when the SOC of the test cell is the lower limit of the predetermined SOC range. In detail, the second negative electrode upper limit denotes a stoichiometric value representing a fourth estimation value within a range of 0 to 1, wherein the third estimation value indicates an amount of operating ions estimated to be stored in the negative electrode of the test cell at a time point when the SOC of the test cell reaches the lower limit of a predetermined SOC range, based on the second critical value. For example, when the amount of operating ions stored in the negative electrode of the test cell is 5% of the second critical value when the SOC of the test cell reaches the lower limit of the predetermined SOC range, the second negative electrode lower limit is 10%/100%=0.10. As the SOC of the test cell decreases, the amount of operating ions stored in the negative electrode of the test value decreases, and thus, it is obvious to one of ordinary skill in the art that the second negative electrode lower limit is less than the second negative electrode upper limit.

Hereinafter, it will be assumed that a positive electrode and a negative electrode of each of the reference cell and the test cell are $Li_xMeO_2$ and $Li_yC_6$, and operating ions involved in the electrochemical reaction that causes charging/discharging of the reference cell and the test cell are lithium ions Li+. Here, x denotes a stoichiometric number representing an amount of lithium ions stored in a positive electrode, and y is a stoichiometric number representing an amount of lithium ions stored in a negative electrode. Also, Me may be a metal element such as Ni, Mn, Mg, and Al.

Also, it will be assumed that the predetermined SOC range is from 0 to 1. One of ordinary skill in the art would have easily appreciated that the SOC of a cell having a value of 1 denotes that a voltage at opposite ends of the cell reaches an upper limit voltage and fully-charged state, and that the SOC of a cell having a value of 0 denotes that a voltage at opposite ends of the cell reaches a lower limit voltage and fully-discharged state.

Although not shown in FIG. 1, the test apparatus 100 may further include an output unit. The output unit outputs the data processed by the test apparatus to be recognizable by a user. For example, the output unit may include a display for outputting the data processed by the test apparatus 100 in a visual format. As another example, the output unit may include a speaker for outputting the data processed by the test apparatus 100 in an audible format. The user may receive a test result of the test cell via the output unit.

Figure 2:
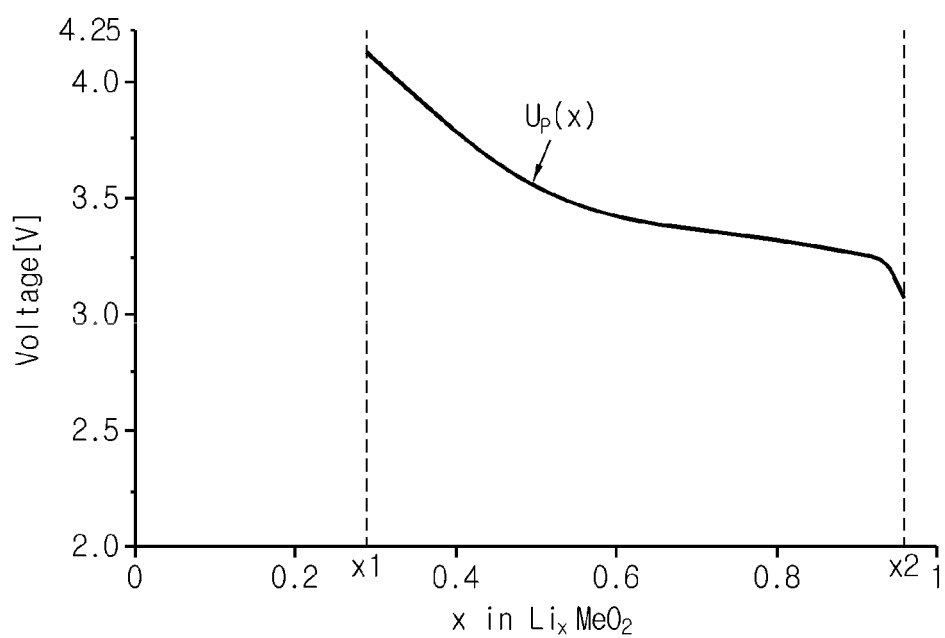
FIGS. 2 and 3 are diagrams showing a positive electrode open-circuit voltage profile of a reference cell provided from first profile data described above with reference to FIG. 1.
Figure 3:
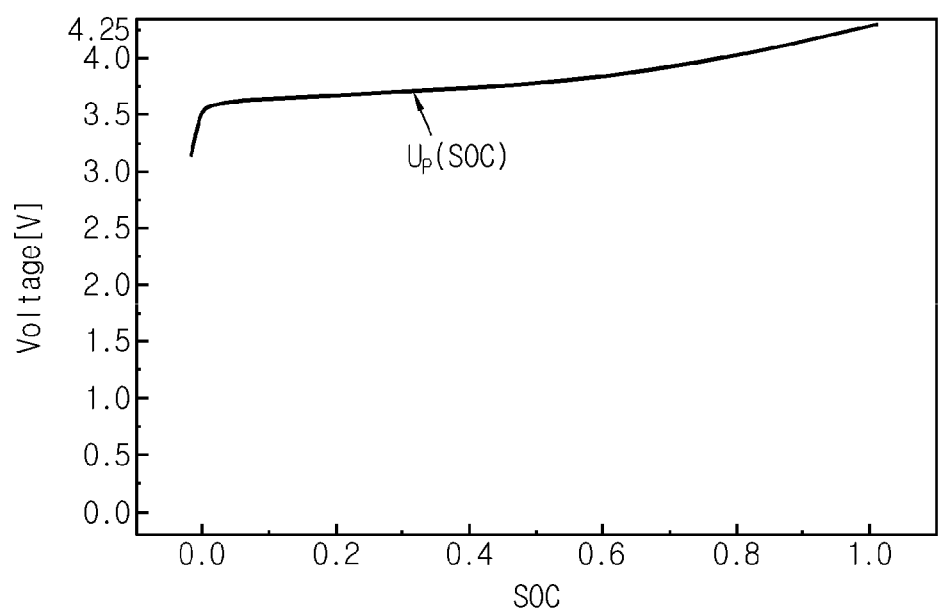

FIGS. 2 and 3 are diagrams showing a positive electrode open-circuit voltage profile of a reference cell provided from first profile data described above with reference to FIG. 1.

Referring to FIG. 2, a positive electrode open-circuit voltage profile $U_P(x)$ of a reference cell, which is measured while the amount x of the lithium ions stored in the positive electrode ($Li_xMeO_2$) of each reference cell is adjusted within a range from a first experiment value x1 to a second experiment value x2 through a preliminary experiment, may be identified. Here, the positive electrode open-circuit voltage of the reference cell is a difference between a positive electrode potential of the reference cell and a reference potential (e.g., 0V). According to the positive electrode open-circuit voltage profile $U_P(x)$ of the reference cell, it may be identified that the positive electrode open-circuit voltage of the reference cell gradually decreases as the amount x of the lithium ions stored in the positive electrode of the reference cell increases from the first experiment value x1 to the second experiment value x2. The amount x of the lithium ions may be determined according to Equation 1 below.

[Equation 1]

$$x = P_i + (1-SOC) \times (P_f - P_i)$$

In Equation 1 above, $P_f$ denotes a first positive electrode upper limit, $P_i$ denotes a first positive electrode lower limit, and SOC denotes a state of charge of the reference cell. Here, since $P_f$ and $P_i$ are constants determined in advance, x depends on the variation in the SOC. That is, when one of x and SOC is provided, the other may be calculated. Referring to FIG. 3 with FIG. 2, the controller 130 may convert the positive electrode open-circuit voltage profile $U_P(x)$ into a positive electrode voltage profile $U_P(SOC)$ according to the state of charge of the reference cell.

Figure 4:
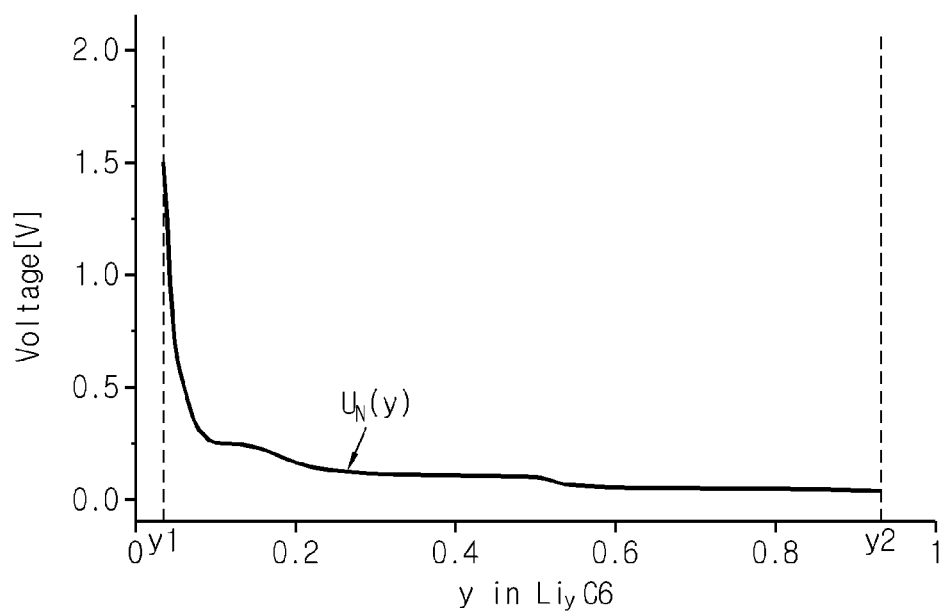
FIGS. 4 and 5 are diagrams showing a negative electrode open-circuit voltage profile of a reference cell provided from second profile data described above with reference to FIG. 1.
Figure 5:
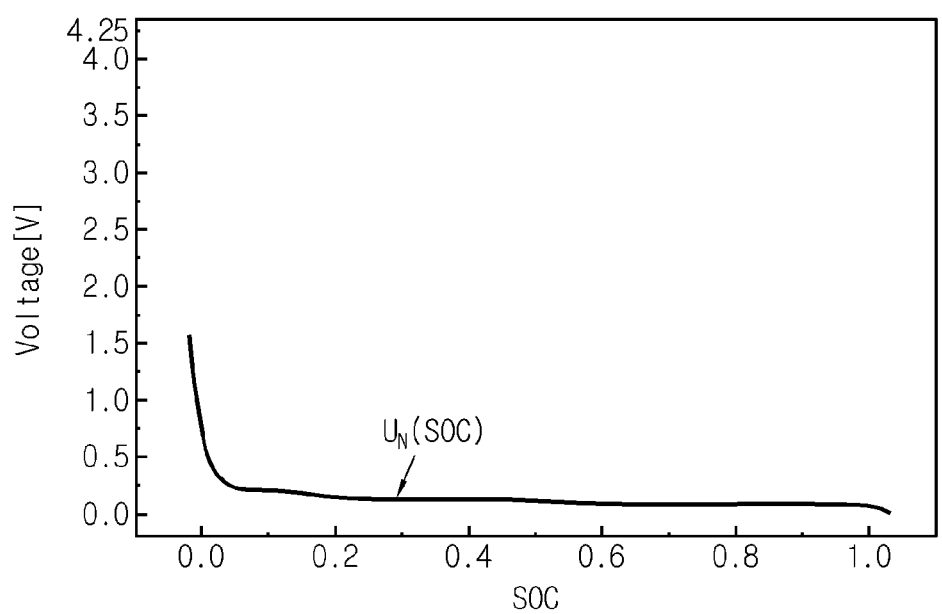

FIGS. 4 and 5 are diagrams showing a negative electrode open-circuit voltage profile of a reference cell provided from the second profile data described above with reference to FIG. 1.

Referring to FIG. 4, a negative electrode open-circuit voltage profile $U_N(y)$ of the reference cell, which is measured while an amount y of lithium ions stored in a negative electrode ($Li_yC_6$) of the reference cell is adjusted within a range between a third experiment value y1 and a fourth experiment value y4, through a preliminary experiment may be identified. Here, the negative electrode open-circuit voltage of the reference cell is a difference between a negative electrode potential of the reference cell and a reference potential. According to the negative electrode open-circuit voltage profile $U_N(y)$ of the reference cell, it may be identified that the negative electrode open-circuit voltage of the reference cell gradually decreases as the amount of the lithium ions stored in the negative electrode of the reference cell increases from the third experiment value y1 to the fourth experiment value y2. The amount y of the lithium ions may be determined according to Equation 2 below.

[Equation 2]

$$y = N_i + SOC \times (N_f - N_i)$$

In Equation 2 above, $N_f$ denotes a first negative electrode upper limit, $N_i$ denotes a first negative electrode lower limit, and SOC denotes a state of charge of the reference cell. Here, since $N_f$ and $N_i$ are constants determined in advance, y depends on the variation in the SOC. That is, when one of y and SOC is provided, the other may be calculated. Referring to FIG. 5 with FIG. 4, the controller 130 may convert the negative electrode open-circuit voltage profile $U_N(y)$ into a negative electrode voltage profile $U_N(SOC)$ according to the state of charge of the reference cell.

Figure 6:
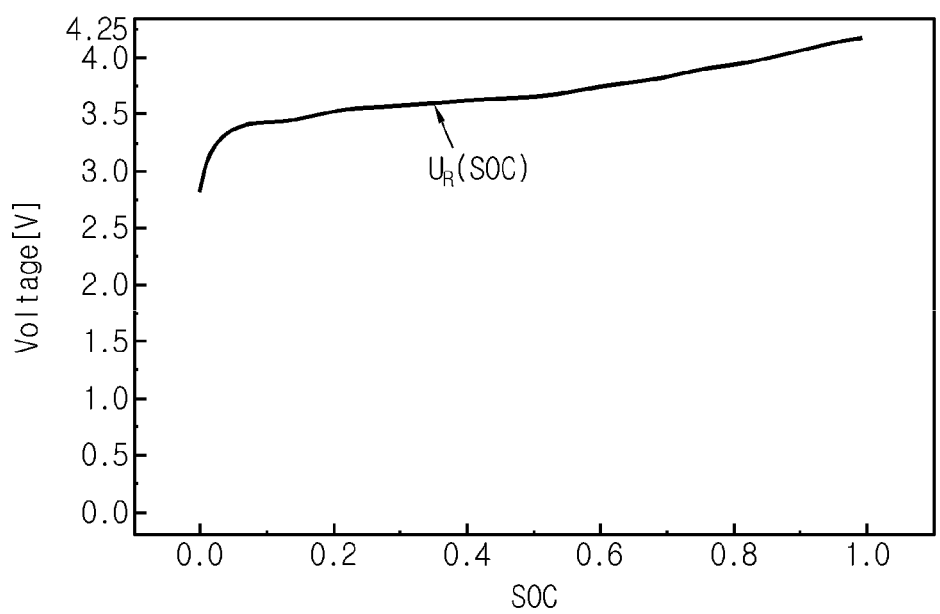
FIG. 6 is a diagram showing open-circuit voltage profile at opposite ends of a reference cell provided from third profile data described above with reference to FIG. 1.

FIG. 6 is a diagram showing opposite ends open-circuit voltage profile of a reference cell provided from the third profile data described above with reference to FIG. 1.

Referring to FIG. 6, an open-circuit voltage profile at opposite ends $U_R(SOC)$ according to a state of charge of one reference cell may be identified. The open-circuit voltage profile at opposite ends $U_R(SOC)$ corresponds to a difference between the positive electrode voltage profile $U_P(SOC)$ shown in FIG. 3 and the negative electrode voltage profile $U_N(SOC)$ shown in FIG. 5 within a range of 0 to 1, e.g., a common SOC range. As described above, the positive electrode voltage profile $U_P(SOC)$ is related to the first profile data, the first positive electrode upper limit, and the first positive electrode lower limit, and the negative electrode voltage profile $U_N(SOC)$ is related to the second profile data, the first negative electrode upper limit, and the first negative electrode lower limit. Therefore, the controller 130 may generate third profile data representing the open-circuit voltage profile at opposite ends $U_R(SOC)$, based on the first profile data, the second profile data, the first positive electrode upper limit, the first positive electrode lower limit, the first negative electrode upper limit, and the first negative electrode lower limit.

Figure 7:
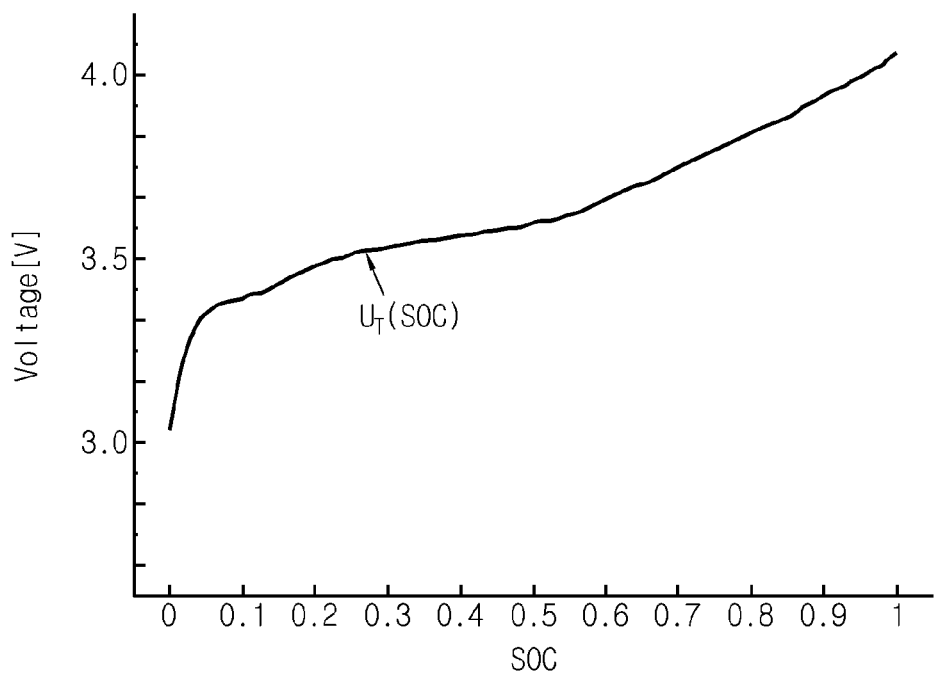
FIG. 7 is a diagram showing opposite ends open-circuit voltage profile of a test cell according to an embodiment of the present disclosure.
Figure 8:
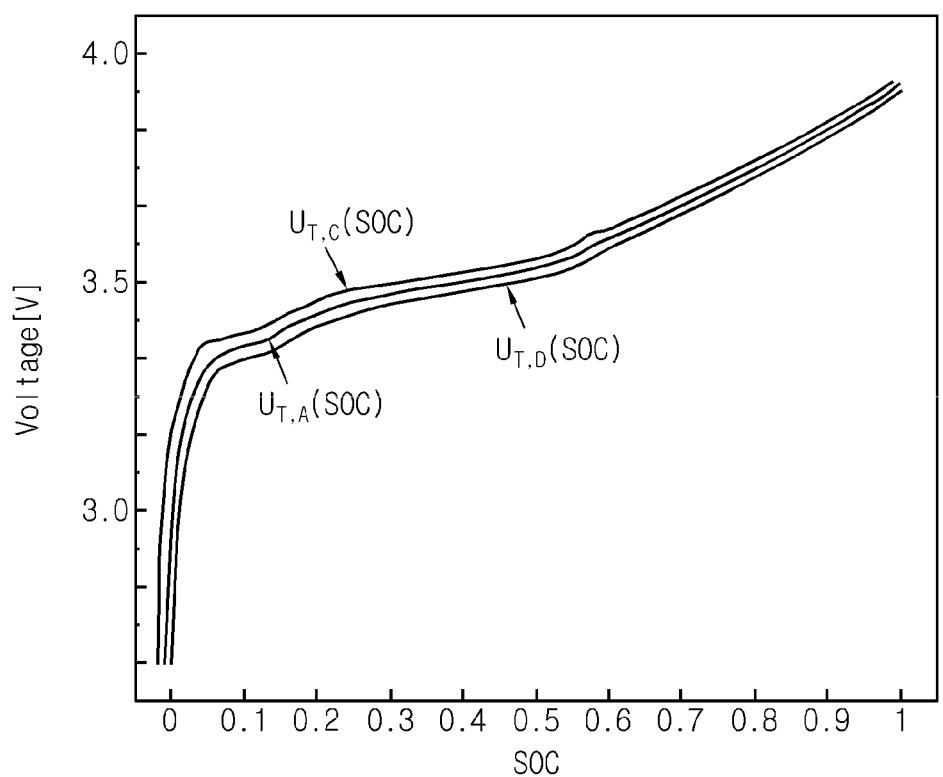
FIGS. 8 and 9 are diagrams showing an example of measuring an open-circuit voltage at opposite ends of a test cell.
Figure 9:
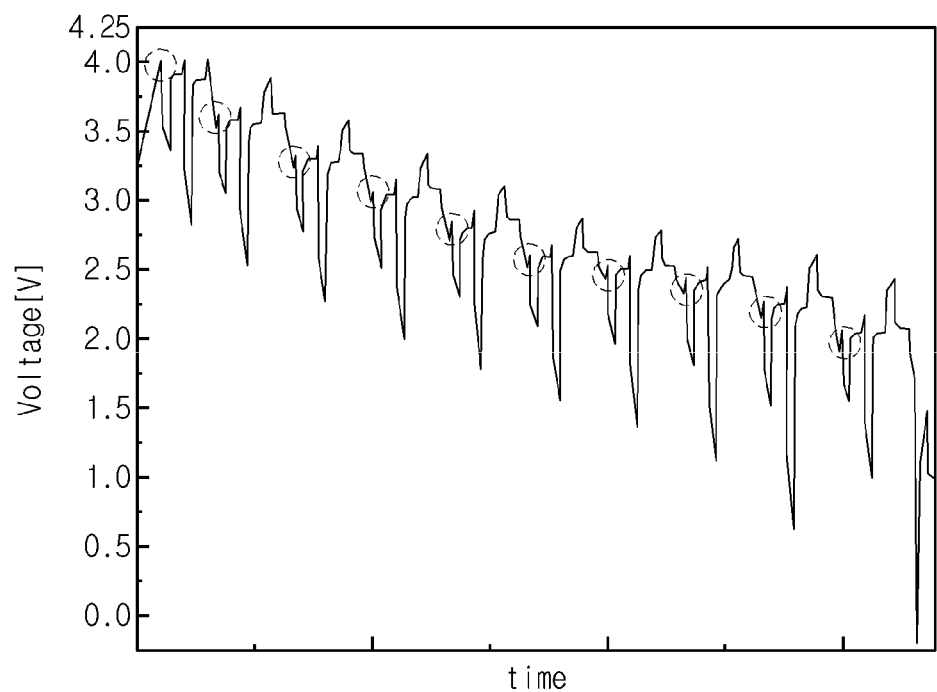

FIG. 7 shows an open-circuit voltage profile at opposite ends of a test cell according to an embodiment, and FIGS. 8 and 9 show an example of a method of measuring an open-circuit voltage at opposite ends of the test cell.

Referring to FIG. 7, in a range of 0 to 1, that is, a predetermined SOC range, an open-circuit voltage profile at opposite ends $U_T(SOC)$ of a test cell is shown, wherein the open-circuit voltage profile at opposite ends is measured by the sensing unit 120. As described above, the controller 130 may generate fourth profile data based on a voltage measurement value provided from the sensing unit 120.

FIG. 8 exemplarily shows a voltage averaging method. Referring to FIG. 8, the controller 130 may set a voltage profile $U_{T,A}(SOC)$ as the open-circuit voltage profile at opposite ends $U_T(SOC)$, wherein the voltage profile $U_{T,A}(SOC)$ corresponds to an average between a voltage profile $U_{T,D}(SOC)$ that is measured during discharging a test cell in a fully-charged state to a fully-discharged state with a predetermined constant current and a voltage profile $U_{T,C}(SOC)$ that is measured during charging a test cell in a fully-discharged state to a fully-charged state with the constant current.

FIG. 9 exemplarily shows a voltage relaxation method. The voltage relaxation method may be a kind of a hybrid pulse power characterization (HPPC) discharging test method. The voltage relaxation method switches the test cell to a no-load state whenever the charging state of the test cell sequentially reaches predetermined SOC values, while the test cell in a fully-charged state is discharged to a fully-discharged state with a predetermined constant current. One of ordinary skill in the art would have appreciated that the charging state of the test cell may be represented as a value indicating a remaining capacity of a test cell within a range of 0 to 1 based on a design capacity value or a maximum capacity value, after calculating the remaining capacity of the test cell by adding up the discharging current flowing from the test cell according to time. Also, the charging state of the test cell may be represented in percentage (%).

At a time point when a predetermined relaxation time (e.g., 1 hr.) has passed from each of the time points of switching to the no-load state (see dashed-line circles of FIG. 9), voltages at opposite ends of the test cell are measured by the sensing unit 120, and a voltage profile following the measured voltage values by using an approximation algorithm such as a curve fitting may be set as the open-circuit voltage profile at opposite ends $U_T(SOC)$.

The controller 130 may generate an open-circuit voltage profile at opposite ends $U_R(SOC, \theta)$ estimated from a battery cell having an arbitrary usage area $\theta=[p_f, p_i, n_f, n_i]$, based on the third profile data obtained from each of a plurality of battery cells. In detail, the open-circuit voltage profile at opposite ends $U_R(SOC, \theta)$ is an open-circuit voltage profile at opposite ends expected to be shown when an SOC of an arbitrary battery cell is adjusted within the predetermined SOC range, wherein the arbitrary battery cell has a positive electrode upper limit $p_f$, a positive electrode lower limit $p_i$, a negative electrode upper limit $n_f$, and a negative electrode lower limit $n_i$.

Figure 10:
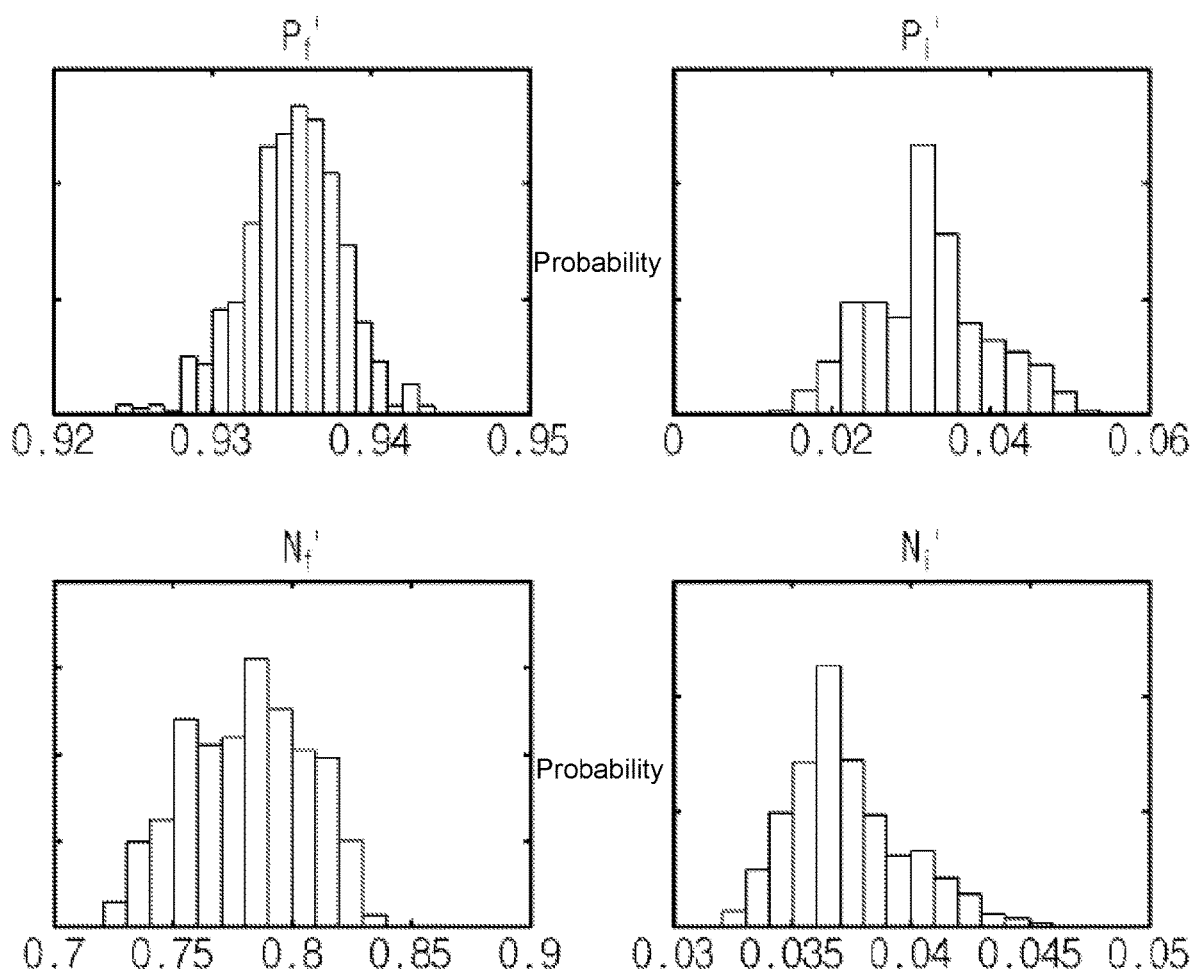
FIG. 10 is a diagram used to illustrate a method of estimating a usage area of a test cell according to an embodiment of the present disclosure.

FIG. 10 is a diagram used to illustrate a method of estimating a usage area of a test cell according to an embodiment of the present disclosure.

The controller 130 may declare a cost function representing a sum of squares of a residual between the open-circuit voltage profile at opposite ends $U_T(SOC)$ and the open-circuit voltage profile at opposite ends $U_R(SOC, \theta)$ by using n predetermined sample values within a range of 0 to 1, e.g., the predetermined SOC range, as input values. The cost function may be expressed via following Equation 4.

[Equation 4]
$$S(\theta) = \sum_{i=1}^{n} |U_T(SOC_i) - U_R(SOC_i, \theta)|^2$$

In Equation 4 above, $SOC_i$ is one of the sample values, and $S(\theta)$ is the cost function.

It is assumed that the open-circuit voltage profile at opposite ends $U_R(SOC, \theta)$ and the open-circuit voltage profile at opposite ends $U_T(SOC)$ completely match with each other, when an arbitrary $\theta$ is given. In this case, an output value of the cost function is clearly 0, and the controller 130 may calculate that the usage area of the test cell is equal to $\theta$. In this aspect, the controller 130 may estimate parameters representing the usage area of the test cell, which makes a value of the cost function minimum, through a predetermined probability model. Here, the usage area of the test cell reflects performance of the test cell.

Algorithms below may be used to estimate the usage area of the test cell from the cost function:

1) gradient base optimization algorithm: fmincon, fminsearch, etc.;

2) global optimization algorithm: simulated annealing and genetic algorithm; and 3) Markov Chain Monte Carlo (MCMC) algorithm: Metropolis-Hastings, Gibbs Sampling, etc.

Of course, other optimization algorithms or Bayesian estimation method than the above-described algorithms may be used to estimate usage area of the test cell.

Referring to FIG. 10, histograms representing posterior distribution with respect to each of four parameters $P_f'$, $P_i'$, $N_f'$, and $N_i'$ regarding the usage area of the test cell, which is calculated from the cost function by using the probability model, may be identified. In each histogram, a transverse axis denotes parameters and a longitudinal axis denotes probability.

For example, the controller 130 may estimate that certain parameter values corresponding to predetermined rules (e.g., having the largest probability value) are respectively the second positive electrode upper limit, the second positive electrode lower limit, the second negative electrode upper limit, and the second negative electrode lower limit of the test cell from each posterior distribution.

The controller 130 may calculate a first capacity value representing a maximum capacity of the positive electrode of the test cell, by using Equation 5 below.

[Equation 5]
$$Q^t_P = Q^t_F/(p_f' - p_i')$$

In Equation 5 above, $Q^t_F$ denotes the maximum capacity value of the test cell, $p_f'$ denotes the estimated second positive electrode upper limit, $p_i'$ denotes the estimated second positive electrode lower limit, and $Q^t_P$ denotes the first capacity value. The maximum capacity value of the test cell may be calculated by the controller 130 based on data provided from the sensing unit 120.

The controller 130 may calculate a second capacity value representing a maximum capacity of the negative electrode of the test cell, by using Equation 6 below.

[Equation 6]
$$Q^t_N = Q^t_F/(n_f' - n_i')$$

In Equation 6 above, $n_f'$ of denotes the estimated second negative electrode upper limit, $n_i'$ denotes the estimated second negative electrode lower limit, and $Q^t_N$ denotes the second capacity value.

In Equations 5 and 6 above, the first capacity value and the second capacity value are maximum charge amounts that may be stored respectively in the positive electrode and the negative electrode of the test cell, and it is obvious that the first and second capacity values are greater than the maximum capacity value that is the charge amount that may be actually extracted from the test cell of a full cell type.

The controller 130 may calculate an irreversible capacity of the test cell with respect to the predetermined SOC range by using Equation 7 below.

[Equation 7]
$$Q_{loss} = (Q^t_P \times p_i') - (Q^t_N \times n_i')$$

In Equation 7 above, $Q_{loss}$ denotes an irreversible capacity of the test cell. $(Q^t_P \times p_i')$ denotes an irreversible capacity of the positive electrode of the test cell, and $(Q^t_N \times n_i')$ denotes an irreversible capacity of the negative electrode of the test cell. If a value $Q_{loss}$ has a positive value, it denotes that the irreversible capacity of the positive electrode is relatively greater than the irreversible capacity of the negative electrode. On the contrary, if a value of $Q_{loss}$ has a negative value, it denotes that the irreversible capacity of the positive electrode is relatively less than the irreversible capacity of the negative electrode.

The controller 130 may calculate a ratio between the maximum capacity of the negative electrode of the test cell and the maximum capacity of the positive electrode of the test cell, by using Equation 8 below.

[Equation 8]

$$R_{NP}=Q^t_N/Q^t_P=(p_f'-p_i')/(n_f'-n_i')$$

In Equation 8 above, $R_{NP}$ denotes a ratio between the maximum capacity of the negative electrode of the test cell and the maximum capacity of the positive electrode of the test cell.

The above calculation results may be provided to the user via the output unit.

Figure 11:
FIG. 11 is a table illustrating a comparison result between an estimated performance and actual performance of a test cell according to an embodiment of the present disclosure.

FIG. 11 is a table 1100 illustrating a comparison result between estimated performance and actual performance of a test cell according to an embodiment of the present disclosure. For convenience of description, numerical values in the table 1100 are expressed to two decimal places.

Referring to FIG. 11, a first row of the table 1100 shows the maximum capacity values of the positive electrode and the negative electrode of the test cell in a case where the second positive electrode upper limit $p_f'$, the second positive electrode lower limit $p_i'$, the second negative electrode upper limit $n_f$, and the second negative electrode lower limit $n_i'$ that are estimated with respect to a test cell having a maximum capacity of 4.22 mAh/cm² are respectively 0.8927, 0.0053126, 0.9265, and 0.068582. The controller 130 obtains the maximum capacity value 4.76 mAh/cm² of the positive electrode by using Equation 5, and obtains the maximum capacity value 4.92 mAh/cm² of the negative electrode by using Equation 6.

Next, a second row of the table 1100 shows the maximum capacity value 4.73 mAh/cm² of the positive electrode and the maximum capacity value 4.94 mAh/cm² of the negative electrode obtained through actual measurement on two half-cells corresponding respectively to the positive electrode and the negative electrode of the test cell.

In addition, a third row of the table 1100 shows an error rate between the measured values shown in the first row and the measured values shown in the second row. As shown in FIG. 11, there are an error rate of +0.63% with respect to the maximum capacity value of the positive electrode and an error rate of −0.40% with respect to the maximum capacity value of the negative electrode, and these are very small values. That is, the table 1100 strongly supports that the performance test result corresponding to the actual performance of the test cell may be obtained without disassembling the test cell when the performance test apparatus 100 according to the embodiment of the present disclosure is used.

Figure 12:
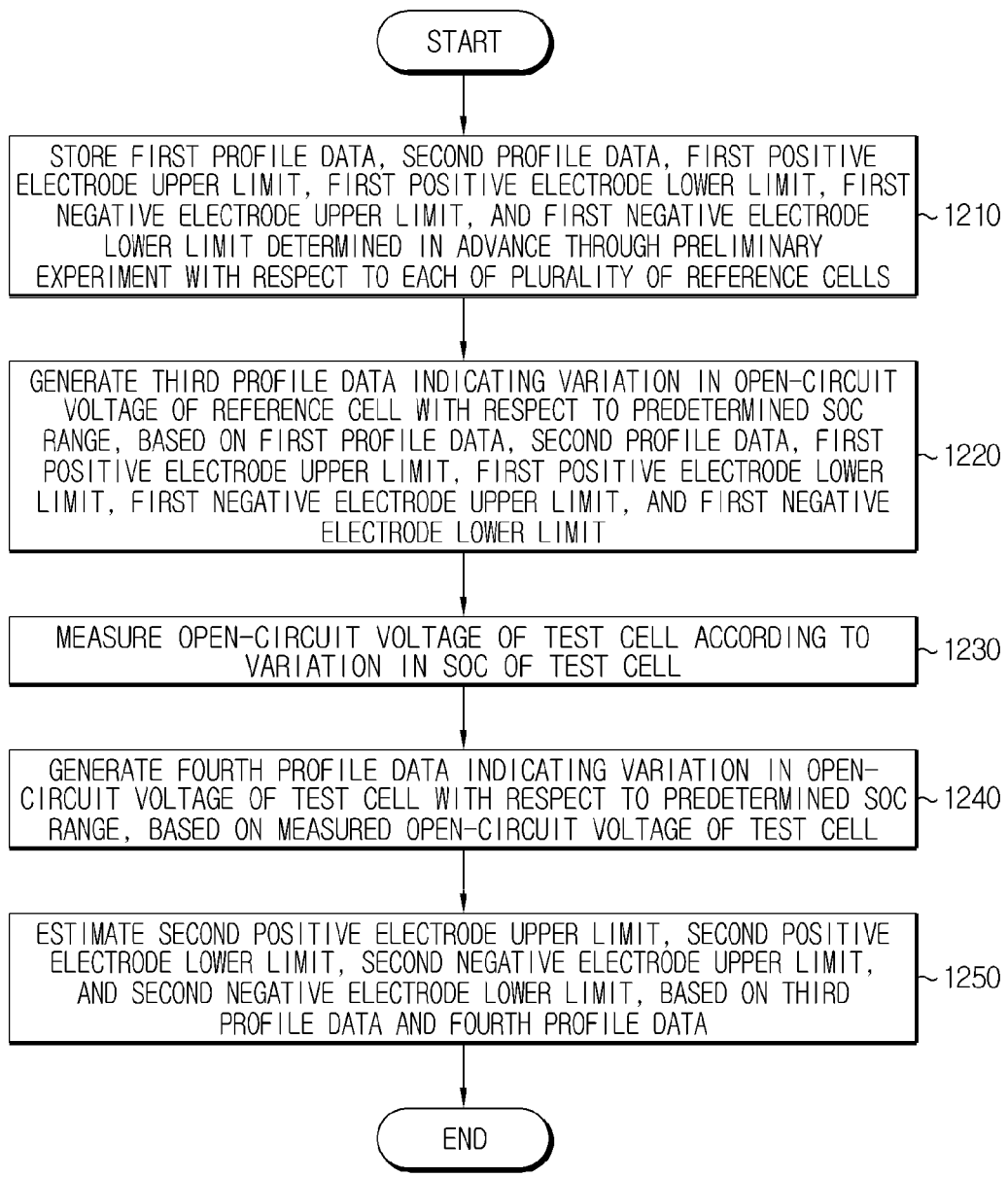
FIG. 12 is a flowchart illustrating a method of testing performance of a battery cell according to an embodiment of the present disclosure.

FIG. 12 is a flowchart illustrating a method of testing performance of a battery cell according to an embodiment of the present disclosure. Processes illustrated in FIG. 12 are performed by the performance test apparatus described above.

At step 1210, first profile data, second profile data, a first positive electrode upper limit, a first positive electrode lower limit, a first negative electrode upper limit, and a first negative electrode lower limit that are determined in advance through a preliminary experiment with respect to each of a plurality of reference cells are stored.

At step 1220, third profile data representing a variation in an open-circuit voltage of the reference cell within a predetermined SOC range is generated based on the first profile data, the second profile data, the first positive electrode upper limit, the first positive electrode lower limit, the first negative electrode upper limit, and the first negative electrode lower limit.

At step 1230, an open-circuit voltage of a test cell according to the variation in the SOC of the test cell is measured.

At step 1240, fourth profile data indicating a variation in an open-circuit voltage at opposite ends of the test cell with respect to the predetermined SOC range is generated based on the measured open-circuit voltage of the test cell.

At step 1250, a second positive electrode upper limit, a second positive electrode lower limit, a second negative electrode upper limit, and a second negative electrode lower limit of the test cell are estimated based on the third profile data and the fourth profile data. In detail, at step 1250, a cost function indicating a sum of squares of a residual between the third profile data and the fourth profile data with respect to a plurality of sample values within the predetermined SOC range is declared, and then, the second positive electrode upper limit, the second positive electrode lower limit, the second negative electrode upper limit, and the second negative electrode lower limit of the test cell, which make the value of the cost function minimum by using the MCMC algorithm, etc., may be estimated through a predetermined probability model.

The above-described embodiments of the present disclosure are not embodied only by an apparatus and/or method. Alternatively, the above-described embodiments may be embodied by a program performing functions, which correspond to the configuration of the exemplary embodiments of the present disclosure, or a recording medium on which the program is recorded, and these embodiments may be easily devised from the description of the above embodiments by one of ordinary skill in the art to which the present invention pertains.

The present disclosure has been described in detail. However, it should be understood that the detailed description and specific examples, while indicating preferred embodiments of the disclosure, are given by way of illustration only, since various changes and modifications within the scope of the disclosure will become apparent to one of ordinary skill in the art from this detailed description.

Also, it will be apparent to one of ordinary skill in the art that modifications and variations may be made without departing from the scope of the present disclosure as defined by the appended claims, and thus, the present disclosure is not limited to the configurations and methods of the foregoing embodiments, but the entirety or a portion of the embodiments may be selectively combined to be configured into various modifications.

What is claimed is:

1. An apparatus for nondestructively testing performance of a battery cell, the apparatus comprising:
   a memory configured to store first profile data, second profile data, a first positive electrode upper limit, a first positive electrode lower limit, a first negative electrode upper limit, and a first negative electrode lower limit that are determined in advance through a preliminary experiment with respect to each of a plurality of reference cells;
   a sensing unit configured to measure an open-circuit voltage of a test cell according to a variation in a state of charge (SOC) of the test cell; and a controller electrically connected to the memory and the sensing unit and configured to test performance of the test cell in a nondestructive manner, wherein the first profile data indicates a variation in an open-circuit voltage of a positive electrode of the reference cell according to a variation in an amount of lithium ions stored in the positive electrode of the reference cell, wherein the second profile data indicates a variation in an open-circuit voltage of a negative electrode of the reference cell according to a variation in an amount of lithium ions stored in the negative electrode of the reference cell, wherein the first positive electrode upper limit corresponds to the amount of lithium ions stored in the positive electrode of the reference cell at an upper limit within a predetermined SOC range, wherein the first positive electrode lower limit corresponds to the amount of lithium ions stored in the positive electrode of the reference cell at a lower limit within the predetermined SOC range, wherein the first negative electrode upper limit corresponds to the amount of lithium ions stored in the negative electrode of the reference cell at an upper limit within the predetermined SOC range, and wherein the first negative electrode lower limit corresponds to the amount of lithium ions stored in the negative electrode of the reference cell at a lower limit within the predetermined SOC range, wherein the controller is configured to:
  generate third profile data indicating a variation in the open-circuit voltage of each of the plurality of the reference cells with respect to the predetermined SOC range, based on the first profile data, the second profile data, the first positive electrode upper limit, the first positive electrode lower limit, the first negative electrode upper limit, and the first negative electrode lower limit;
  generate fourth profile data indicating a variation in an open-circuit voltage at opposite ends of the test cell with respect to the predetermined SOC range measured by the sensing unit;
  estimate a first test result including a second positive electrode upper limit and a second positive electrode lower limit of the test cell, and a second test result including a second negative electrode upper limit and a second negative electrode lower limit of the test cell, based on the third profile data and the fourth profile data; and wherein the second positive electrode upper limit corresponds to the amount of lithium ions stored in a positive electrode of the test cell at an upper limit within the predetermined SOC range, wherein the second positive electrode lower limit corresponds to an amount of lithium ions stored in the positive electrode of the test cell at a lower limit within the predetermined SOC range, wherein the second negative electrode upper limit corresponds to an amount of lithium ions stored in a negative electrode of the test cell at an upper limit within the predetermined SOC range, wherein the second negative electrode lower limit corresponds to an amount of lithium ions stored in the negative electrode of the test cell at a lower limit of the predetermined SOC range, and wherein the apparatus further comprises an output unit configured to output the first test result indicating performance of a positive electrode of the test cell and the second test result indicating performance of a negative electrode of the test cell.

2. The apparatus of claim 1, wherein the controller is configured to declare a cost function indicating a sum of squares of a residual between the third profile data and the fourth profile data with respect to a plurality of sample values within the predetermined SOC range, and to estimate the second positive electrode upper limit, the second positive electrode lower limit, the second negative electrode upper limit, and the second negative electrode lower limit of the test cell, which make a value of the cost function minimum through a predetermined probability model.

3. The apparatus of claim 2, wherein the controller is configured to estimate the second positive electrode upper limit, the second positive electrode lower limit, the second negative electrode upper limit, and the second negative electrode lower limit of the test cell, which make the value of the cost function minimum, by using an optimization algorithm given in advance or a Bayesian estimation method.

4. The apparatus of claim 1, wherein the memory is configured to further store a maximum capacity value of the test cell, and
  the controller is configured to calculate a first capacity value indicating a maximum capacity of the positive electrode of the test cell by using equation 1 below, and to calculate a second capacity value indicating a maximum capacity of the negative electrode of the test cell by using equation 2 below

[Equation 1]

$$Q^t_P = Q^t_F/(p_f' - p_i')$$

[Equation 2]

$$Q^t_N = Q^t_F/(n_f' - n_i'),$$

where $Q^t_F$ denotes the maximum capacity value, $p_f'$ denotes the second positive electrode upper limit, $p_i'$ denotes the second positive electrode lower limit, $n_f'$ denotes the second negative electrode upper limit, $n_i'$ denotes the second negative electrode lower limit, $Q^t_P$ denotes the first capacity value, and $Q^t_N$ denotes the second capacity value.

5. The apparatus of claim 4, wherein the controller is configured to calculate an irreversible capacity of the test cell by using equation 3 below

[Equation 3]

$$Q_{loss} = (Q^t_P \times p_i') - (Q^t_N \times n_i'),$$

where $Q_{loss}$ denotes the irreversible capacity.

6. The apparatus of claim 4, wherein the controller is configured to calculate a ratio between the maximum capacity of the negative electrode of the test cell and the maximum capacity of the positive electrode of the test cell by using equation 4 below

[Equation 4]

$$R_{NP} = Q^t_N/Q^t_P = (p_f' p_i')/(n_f' - n_i'),$$

where $R_{NP}$ denotes the ratio between the maximum capacity of the negative electrode of the test cell and the maximum capacity of the positive electrode of the test cell.

7. The apparatus of claim 1, wherein the controller is configured to generate the fourth profile data by averaging a voltage profile during charging the test cell and a voltage profile during discharging the test cell within the predetermined SOC range.

8. The apparatus of claim 1, wherein the controller is configured to generate the fourth profile data based on a voltage at opposite ends of the test cell, which is measured through a voltage relaxation method, within the predetermined SOC range.

9. A method of nondestructively testing performance of a battery cell, the method comprising:
(a) storing, by a memory, first profile data, second profile data, a first positive electrode upper limit, a first positive electrode lower limit, a first negative electrode upper limit, and a first negative electrode lower limit that are determined in advance through a preliminary experiment with respect to each of a plurality of reference cells;
(b) generating, by a controller electrically connected to the memory, third profile data indicating a variation in an open-circuit voltage of the each of the plurality of reference cells within a predetermined state of charge (SOC) range, based on the first profile data, the second profile data, the first positive electrode upper limit, the first positive electrode lower limit, the first negative electrode upper limit, and the first negative electrode lower limit;
(c) measuring, by the controller, an open-circuit voltage of a test cell according to a variation in an SOC of the test cell;
(d) generating, by the controller, fourth profile data indicating a variation in an open-circuit voltage at opposite ends of the test cell with respect to the predetermined SOC range, based on measured open-circuit voltage of the test cell; and
(e) estimating, by the controller, a first test result including a second positive electrode upper limit and a second positive electrode lower limit of the test cell, and a second test result including a second negative electrode upper limit and a second negative electrode lower limit of the test cell, based on the third profile data and the fourth profile data;
(f) outputting, by an output unit electrically connected to the controller, the first test result indicating performance of a positive electrode of the test cell and a second test result indicating performance of a negative electrode of the test cell,
wherein the first profile data indicates a variation in an open-circuit voltage of a positive electrode of the reference cell according to a variation in an amount of lithium ions stored in the positive electrode of the reference cell,
the second profile data indicates a variation in an open-circuit voltage of a negative electrode of the reference cell according to a variation in an amount of lithium ions stored in the negative electrode of the reference cell, the first positive electrode upper limit corresponds to the amount of lithium ions stored in the positive electrode of the reference cell at an upper limit within the predetermined SOC range,
the first positive electrode lower limit corresponds to the amount of lithium ions stored in the positive electrode of the reference cell at a lower limit within a predetermined SOC range,
the first negative electrode upper limit corresponds to the amount of lithium ions stored in the negative electrode of the reference cell at an upper limit within the predetermined SOC range,
the first negative electrode lower limit corresponds to the amount of lithium ions stored in the negative electrode of the reference cell at a lower limit within the predetermined SOC range,
the second positive electrode upper limit corresponds to the amount of lithium ions stored in a positive electrode of the test cell at an upper limit within the predetermined SOC range,
the second positive electrode lower limit corresponds to an amount of lithium ions stored in the positive electrode of the test cell at a lower limit within the predetermined SOC range,
the second negative electrode upper limit corresponds to an amount of lithium ions stored in a negative electrode of the test cell at an upper limit within the predetermined SOC range, and
the second negative electrode lower limit corresponds to an amount of lithium ions stored in the negative electrode of the test cell at a lower limit of the predetermined SOC range.

10. The method of claim 9, wherein the operation (e) comprises:
(e-1) declaring a cost function indicating a sum of squares of a residual between the third profile data and the fourth profile data with respect to a plurality of sample values within the predetermined SOC range, and
(e-2) estimating the second positive electrode upper limit, the second positive electrode lower limit, the second negative electrode upper limit, and the second negative electrode lower limit of the test cell, which make a value of the cost function minimum through a predetermined probability model.

11. The method of claim 10, wherein the operation (e-2) comprises estimating the second positive electrode upper limit, the second positive electrode lower limit, the second negative electrode upper limit, and the second negative electrode lower limit of the test cell, which make the value of the cost function minimum, by using an optimization algorithm given in advance or a Bayesian estimation method.

* * * * *